(12) United States Patent
Takenouchi

(10) Patent No.: US 6,314,554 B1
(45) Date of Patent: Nov. 6, 2001

(54) METHOD OF GENERATING MASK PATTERN DATA FOR GRAPHICS AND APPARATUS FOR THE SAME

(75) Inventor: Ryuji Takenouchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/225,833

(22) Filed: Jan. 6, 1999

(30) Foreign Application Priority Data

Jan. 7, 1998 (JP) .................................................. 10-001564

(51) Int. Cl.⁷ .............................. G06F 17/50; G06F 19/00
(52) U.S. Cl. .................................. 716/21; 430/5; 378/35; 382/144
(58) Field of Search ........................ 716/19–21; 430/4–5; 378/34–35; 382/144

(56) References Cited

U.S. PATENT DOCUMENTS

| | | | |
|---|---|---|---|
| 4,442,188 | * | 4/1984 | Chiang ...................................... 430/5 |
| 5,541,025 | * | 7/1996 | Oi et al. .................................... 430/5 |
| 5,698,859 | * | 12/1997 | Haruki ............................ 250/492.22 |

OTHER PUBLICATIONS

IBM TDB Document No. NN74122005, "Algorithm for Uniformly Modifying Polygonal Shapes for Graphical Design by Shifting and Modifying Line Segments", IBM Technical Disclosure Bulletin, vol. 17, No. 7, pp. 2005–2008, Dec. 1974.*

IBM TDB Document No. NN73091351, "Polygon Fill Routine for Artwork Generators", IBM Technical Disclosure Bulletin, vol. 16, No. 4, pp. 1351–1353, Sep. 1973.*

Lopez et al. "Efficient Net Extraction for Restricted Orientation Designs", IEEE Transactions on Computer–Aided Design of Integrated Circuits and Systems, vol. 15, No. 9, pp. 1151–1159, Sep. 1996.*

Lee et al., "Extraction of straight line segments using perceptual organization and fuzzy thresholding method", IEEE World Congress on Computational Intelligence, Proceedings of the Third IEEE Conference on Fuzzy Systems, 1994, vol. 3, pp. 2002–2007, Jun. 1994.*

* cited by examiner

Primary Examiner—Matthew Smith
Assistant Examiner—Phallaka Kik
(74) Attorney, Agent, or Firm—Ronald P. Kananen; Rader, Fishman & Grauer

(57) ABSTRACT

A method of generating mask pattern data for graphics and an apparatus for the same are provided wherein each line segment as a processing unit for graphic arithmetic processing is stored as data in tree structure evenly divided into two for every partial region obtained by plurally dividing the overall pattern data, and this partial region is formed by equally dividing the pattern data by m in an X axis direction, and among the regions, those which includes line segments intensively are further divided to form data of tree structure evenly divided into two for every divided region.

10 Claims, 8 Drawing Sheets

SCANNING LINE

METHOD OF GENERATING MASK PATTERN DATA FOR GRAPHICS AND APPARATUS FOR THE SAME

BACKGROUND OF THE INVENTION

1. Field of the Invention

The present invention relates to a method and apparatus for generating a mask pattern data used for a high speed mask patterning by an electron beam from an original mask pattern data during a photo mask production for a semiconductor device.

2. Description of the Related Art

When transferring a mask pattern by irradiating electron beam on a photo mask substrate formed by coating an electron beam resist on film material, it is necessary to convert a designed original mask pattern data to a mask pattern data for a graphic processing apparatus. In the converting processing of the mask pattern data, various graphic signal processing is carried out such as the processing for avoiding the overlapping of patterns accepted in designing mask pattern data for preventing multiple pattern drawing and the processing of the inter-layers for generating pattern data based on a mask pattern data of other layers.

In order to perform the graphic signal processing effectively at a high speed, a variety of methods are proposed. One of them is known as a plane scanning method.

The plane scanning method will be explained with reference to FIGS. 6A to 6C.

When processing the pattern data as shown in FIG. 6A, a line called a scanning line in parallel with an X axis or a Y axis (X axis in FIG. 6B) is moved along vertexes of each pattern as shown in FIG. 6B. Then any desired graphic signal processing is performed to a figure between a current scanning line and a previous scanning line.

When the scanning line is applied in the same way as in FIG. 6B to the pattern data shown in FIG. 6A, the processing such as the judging and eliminating of overlap is performed for each region divided by the scanning lines while moving the scanning line. As a result, the mask pattern data for the graphic processing as shown in FIG. 6C is generated which is expressed as a group of rectangles without overlapping and a group of trapezoids.

In the processing using the plane scanning method, the processing is carried out by a unit of a line segment divided by each scanning line. Accordingly, each line segment is sorted with respect to the X axis to be controlled and it is necessary to delete or insert a line segment every time the desired graphic signal processing is carried out by moving the scanning line.

In order to effectively control the line segments and to easily delete or insert them, the data for the line segments are usually stored in a balanced two branch tree structure of evenly divided into two as shown in FIGS. 7A and 7B.

Recently, patterns of semiconductor devices have become precise and complex so that the processing time needed for converting the designed mask pattern data into the mask pattern data for the graphic processing rendered with electron beam has become enormous, and therefore high speed processing is desired.

In the converting process as explained above, majority of the time in preparing data for the graphic processing apparatuses is spent for the graphic signal processing such as the processing for eliminating overlap of patterns to prevent multiple pattern drawing and the processing of inter-layers for generating the pattern data based on the mask pattern data of other layers. Among the processing, the accessing of the above line segment data having a balanced two branch tree structure of evenly divided into two, that is, the processing for inserting, deleting and searching of the above line segment is the most time consuming process.

In the data having the tree structure of evenly divided into two, as shown in FIGS. 7A and 7B, when assuming a number of stored data as n, a depth of the data structure of evenly divided into two becomes logarithm n. Accordingly, when accessing the data, an access is made to the deepest point at the worst case so that it becomes necessary to compare logarithm n data elements making the time for accessing long. This long accessing time affects the whole converting processing of the mask pattern data for the graphic processing rendered with electron beam as explained above.

SUMMARY OF THE INVENTION

An object of the present invention is to provide a mask pattern generating method capable of generating in high speed mask pattern data for graphics rendered with electron beam by improving accessing speed to a line segment data.

Another object of the present invention is to provide a mask pattern data generating apparatus capable of generating high speed mask pattern data for graphics rendered with electron beam by improving accessing speed to line segment data.

To attain the above objects, a line segment data indicated in vector is classified under sections wherein the line segment exists, then the line segment data of each section is stored in the branch tree structure of evenly divided into two in the graphic signal processing using a plane scanning method.

Accordingly, a method of generating mask pattern data for graphics of the present invention for generating mask pattern data for a graphic processing from a mask pattern data indicated by line segments at least including line segments indicating a contour of a mask pattern, includes the steps of: extracting the line segments except line segments in a predetermined direction from the line segments of said mask pattern data; dividing each of said extracted line segment by a line in parallel with said predetermined direction passing through both ends of each said line segment; dividing a region of said mask pattern into a plurality of regions in said predetermined direction; storing each of said divided line segments existing in said region in a tree structure of evenly divided into two for every said divided region; accessing each of the stored line segments in the tree structure of divided into two for every said region; and generating mask pattern data for graphic processing in which a contour of the mask pattern is indicated by the line segments on the basis of the results of said graphic arithmetic processing.

According to the method of generating mask pattern data for graphics, when performing a graphic arithmetic processing, stored data in a tree structure of evenly divided into two, wherein the line segment data, including a line segment to be processed is stored based on the region is selected first, then a desired line segment data is accessed from the stored data in the selected tree structure of evenly divided into two. Next, desired graphic arithmetic processing is carried out by accessing the line segments successively, and mask pattern data for graphics is finally generated based on the results of the graphic arithmetic processing.

An apparatus for generating mask pattern data for graphics for generating mask pattern data for graphics from mask pattern data indicated by line segments at least including line segments indicating contour of mask pattern, comprises: a line segment extracting means for extracting line segments except line segments in a predetermined direction from line segments of said mask pattern data; a line segment dividing means for dividing each of said extracted line segments by a line parallel to said predetermined direction passing through both ends of said each line segments; a region dividing means for dividing regions of said mask pattern into a plurality of regions in said predetermined direction; a line segment storing means for storing each of said divided line segments existing in the region in a tree structure of evenly divided into two for every divided region; a graphic arithmetic processing means for performing desired graphic arithmetic processing for a unit of processing which is each of said divided line segments by accessing to each line segment stored in a tree structure evenly divided into two for each said region; and a graphic data generating means for generating mask pattern data for graphics indicating contour of a mask pattern by line segments based on the results of said graphic arithmetic processing.

In such an apparatus for generating a mask pattern data for graphics, line segments except line segments in a predetermined direction are extracted from line segments of original mask pattern in a line segments extracting method, and the extracted line segments are further divided by a line in parallel with the predetermined direction passing through the both ends of each line segments in a line segment dividing method. Moreover, the whole region of the mask pattern is divided into a plurality of regions in the predetermined direction by a region dividing method. Then, a line segment storing method stores each divided line segment existing in the region in a tree structure of evenly divided into two by every divided region.

The graphic arithmetic processing method selects stored data in a tree structure of evenly divided into two which stores data of the line segment based on a region including a line segment to be processed first. Then, accesses to the desired line segment data from the stored data in the selected tree structure of evenly divided into two, and performs desired processing such as processing to prevent overlapping of patterns and processing of in-between layers to generate pattern data based on mask pattern data of other layers.

A method for generating data for graphics generates mask pattern data for graphics wherein contour of the mask pattern is indicated by line segments based on the results of the graphic arithmetic processing.

Preferably, an apparatus for generating mask pattern data for graphics of the present invention further includes: a region subdividing means for further dividing each of said divided regions in order to suppress the number of line segments existing in a region at not more than a predetermined number when number of said divided line segments existing in the region is more than the predetermined number; and wherein said line segment storing means stores each of said subdivided line segments existing in the region for every said subdivided region in a tree structure of evenly divided into two.

Preferably, the apparatus for generating mask pattern data for graphics a corresponding line segment detecting means for detecting a pair of line segments indicating contour of identical mask pattern in each of said region from the line segments obtained from the results of said graphic arithmetic processing; a line segments unifying means for forming a new pair of line segments crossing between said divided regions by unifying the continuous portions when both the pair of line segments are continuous between said divided regions among said pair of line segments detected; a rectangle forming means for combining corresponding ends of the line segments by a line in said predetermined direction to new pair of line segments formed and said pairs of line segments detected and not unified.

BRIEF DESCRIPTION OF THE DRAWINGS

These and other objects and features of the present invention will become clearer from the following description of the preferred embodiments given with reference to the accompanying drawings, in which:

FIGS. 2A to 2E are views of a specific example of the method for generating mask pattern data shown in FIG. 1, wherein FIG. 2A is a view of an example of an input pattern data, FIG. 2B is a view of processing results of indicating line segments in vector, FIG. 2C is a view of results of graphic arithmetic processing, FIG. 2D is a view of results of processing of combining line segments in processing for indicating by rectangle and/or trapezoid, and FIG. 2E is a view of generated mask pattern data for graphic rendered with electron beam.

FIGS. 6A to 6C are views for explaining a plane scanning method, wherein FIG. 6A is a view of an example of a pattern data, FIG. 6B is a view for explaining a scanning line, and FIG. 6C is a view of conditions of results of processing based on the scanning line shown in FIG. 6B to the pattern data shown in FIG. 6A.

DESCRIPTION OF THE PREFERRED EMBODIMENTS

Below, a preferred embodiment will be described with reference to FIGS. 1 to 4.

Figure 1:
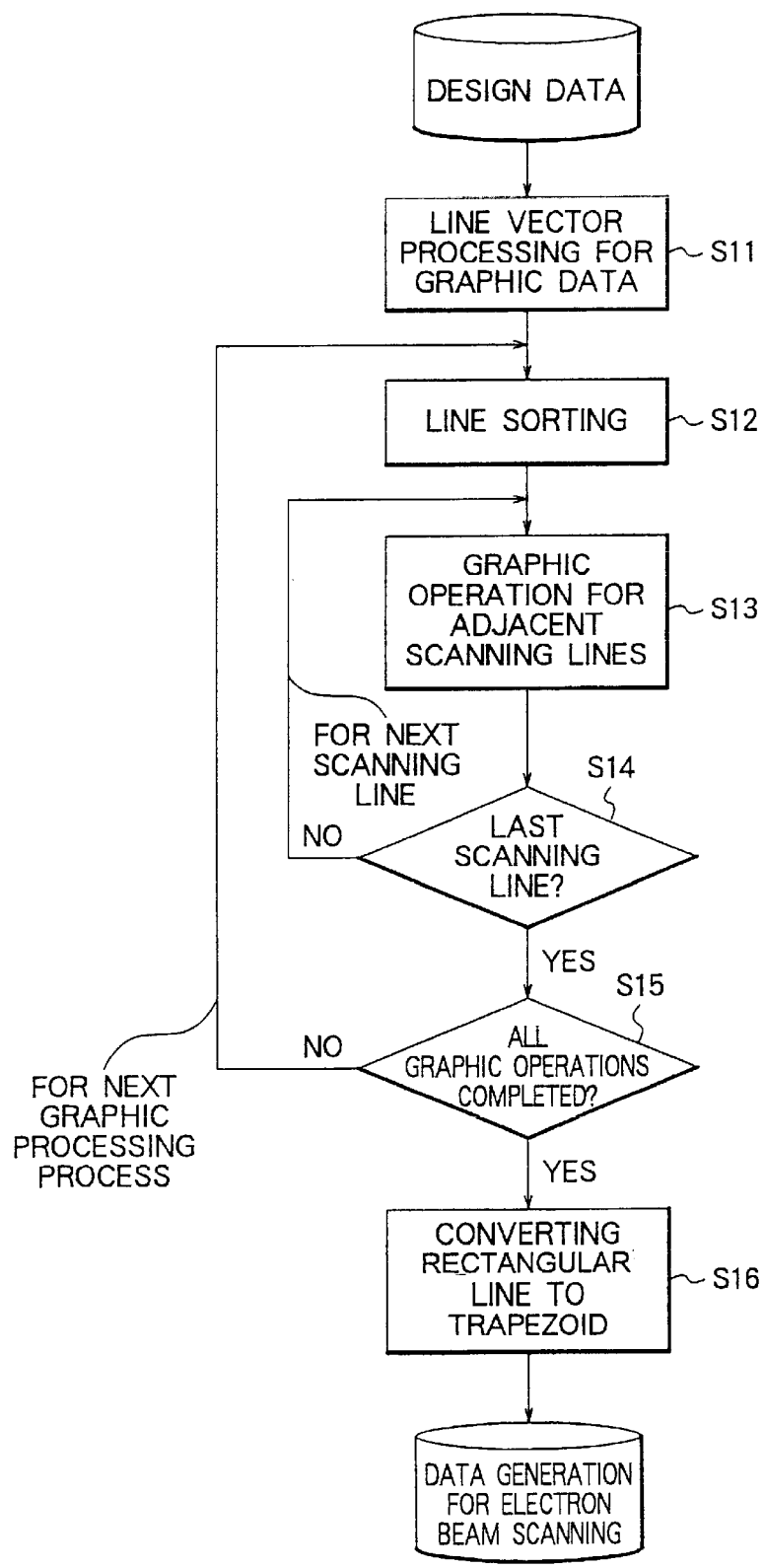
FIG. 1 is a flow chart for explaining a method for generating mask pattern data for graphics according to a first embodiment of the present Invention.

FIG. 1 is a flow chart of a method for generating mask pattern data of the present embodiment.

Note that the processing of generating actual pattern data is carried out by an apparatus for generating mask pattern data according to the present invention, which is configured by setting the processing procedures of generating a mask pattern data as shown in FIG. 1 to, for example, a general-purpose arithmetic operation apparatus such as a computer.

First, each step of the mask pattern generating method of the present embodiment will be explained with reference to FIG. 1.

When a mask pattern data obtained by the results of designing in a form of, for example, accepting overlapping is input, the processing of indicating the pattern data in a line segment vector is carried out (step S11). Specifically, the line segments in parallel with an X axis are removed from the input pattern data to obtain data with the line segments excluding line segments in parallel with the X axis.

At this time, by making the line segments after arranging rows of vertexes of the original pattern in an order, the line segments are recognized as to which side (right of left) of it is inside the figure.

Desired graphic arithmetic processing is carried out successively to each line segment data extracted as above (step S12 to step S15).

First, in order to arrange the line segments to be processed in an order suitable for graphic arithmetic processing using a plane scanning method, a line segment sort processing is carried out (step S12). Namely, ends of each line segments are sorted in a direction of the Y axis.

Next, the desired graphic arithmetic processing is carried out to a line segment existing between a current line segment and a previous line segment while moving a scanning line along the ends with respect to the sorted line segments (steps S13 and S14).

In the present embodiment, as a first graphic arithmetic processing, the processing of eliminating overlapping pattern data is carried out in order to prevent multiple exposure. Specifically, the detecting for overlap is carried out for the line segments having the relationships that a pattern is existing inside another pattern from a line segment existing between the current scanning line and the previous scanning line. When detected, processing of selecting line segments is carried out wherein the internal line segments are eliminated and the outermost line segments are left (step S13).

Along with the move of the first scanning line in this graphic arithmetic processing, the line segments existing between the scanning lines are sorted with respect to the X axis and stored in a tree structure of evenly divided into two.

Accordingly, in an actual processing of the eliminating overlapping line data is successively read in order from data at smaller coordinates of the X axis from a group of data of the tree structure of evenly divided into two, the line segments are appropriately deleted by the processing of eliminating overlapping, and update processing is carried out to the group of data in the tree structure of evenly divided into two.

In each graphic arithmetic processing, after completing the processing for eliminating overlapping to the last scanning line, it is checked whether or not another graphic arithmetic processing would further be carried out (step S15). When determined, the processing goes back to step S2 and perform the next desired graphic arithmetic processing.

In the first embodiment, the processing of interlayers as a second graphic arithmetic processing is carried out after the processing of eliminating overlapping.

In each graphic arithmetic processing from the second processing, the desired processing is carried out using the line segment data in the tree structure of evenly divided into two sorted with respect to the X axis and the line segment data is updated properly.

When completing all graphic arithmetic processing (step S15), the processing of making line segments into rectangles and trapezoids is carried out in order to generate the mask pattern data for graphics (step S16). Specifically, by referring to the finally obtained line segments data in the tree structure of evenly divided into two, the relationship of a symmetry at both sides of (right and left) the line segments is detected. Then, the line segments being continuously symmetric are combined and ends of the obtained segments are connected by a line segment in parallel with the X axis to obtain the pattern data of rectangle or trapezoid.

The obtained pattern data of rectangle or trapezoid is output as pattern data for graphics.

Next, the method of generating mask pattern data will be explained in detail with reference to FIGS. 2A to 2E and 3.

FIGS. 2A to 2E and 3 are views of a specific example of processing of converting the mask pattern data of the results of designing shown in FIG. 1 to the mask pattern data for graphics.

Figure 2A:
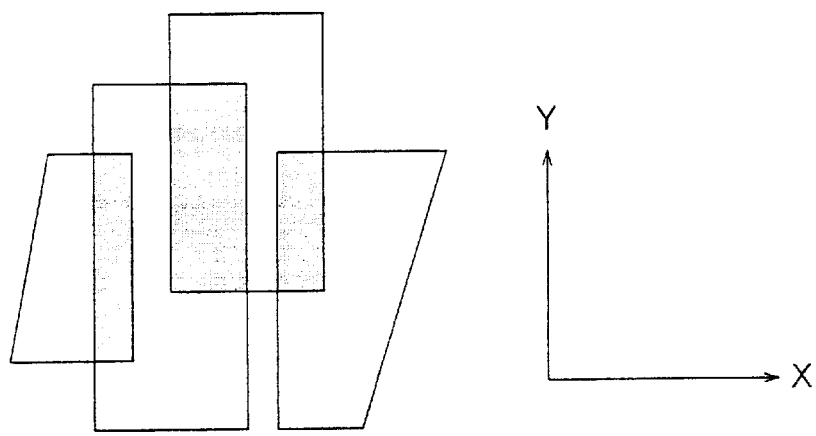
Figure 2B:
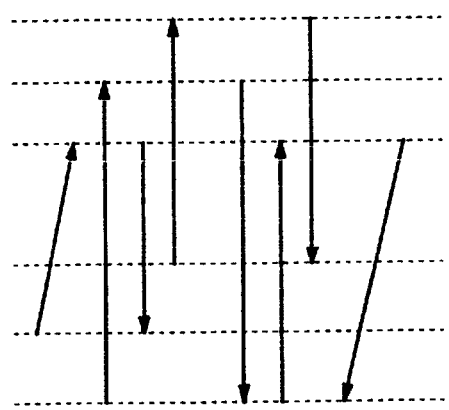

When the mask pattern data in a form of accepting overlapping obtained as a results of designing is input as shown in FIG. 2A, the line segments in parallel with the X axis are removed from the pattern data and the data is converted to the data having only the line segments including the line segments parallel to the X axis as shown in FIG. 2B. Note that in FIG. 2B, vertexes of each pattern are sorted in a clockwise direction and the right side with respect to the arrow direction indicates a region inside a shape.

The processing for eliminating overlapping as a first graphic arithmetic processing is carried out to each line segment data extracted as above.

First ends of each line segments are sorted in a direction of the X axis, and line segments having relationships that a pattern exists in a pattern from the line segments existing between the current scanning line and the previous scanning line are deleted while moving the scanning line along the ends with respect to the sorted line segments. As a result, only the outermost line segments on the right and the left remain.

Figure 2C:
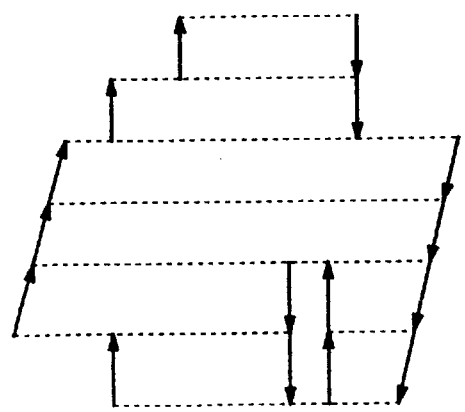

When completing the above processing to the scanning lines, pattern data is obtained as the results of combining line segments wherein overlapping is eliminated as shown in FIG. 2C from the pattern data shown in FIG. 2B.

Each line segment data divided by scanning lines as above is stored in a tree structure of evenly divided into two. Desired graphic processing such as processing of in-between layers is successively carried out by the line segment data as a processing unit.

Figure 2D:
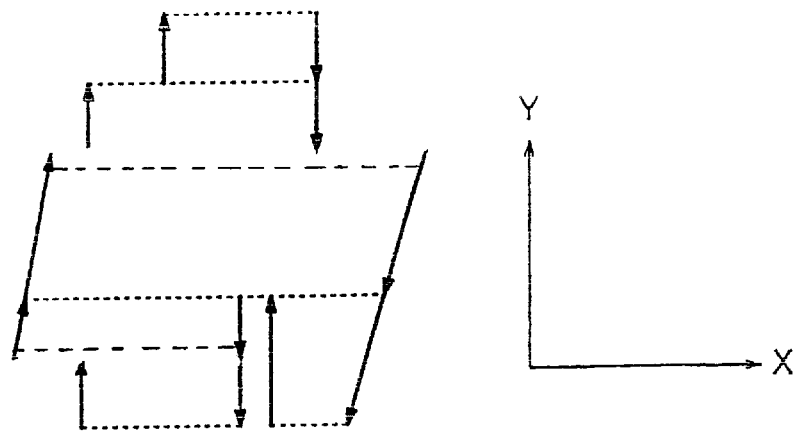

When all graphic arithmetic processing is completed, pairs of symmetric line segments are extracted from the obtained line segment data. Then, the line segments being continuously symmetric are combined to obtain pattern data wherein the line segments are unified in corresponding to the right and the left as shown in FIG. 2D.

Figure 2E:
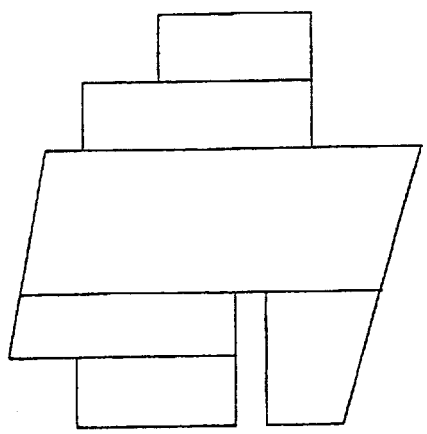

Finally, by connecting the ends by a line segment in parallel with the X axis, the pattern data for the electron beam graphic drawing indicated by rectangles and trapezoids as shown in FIG. 2E can be obtained.

Figure 3:
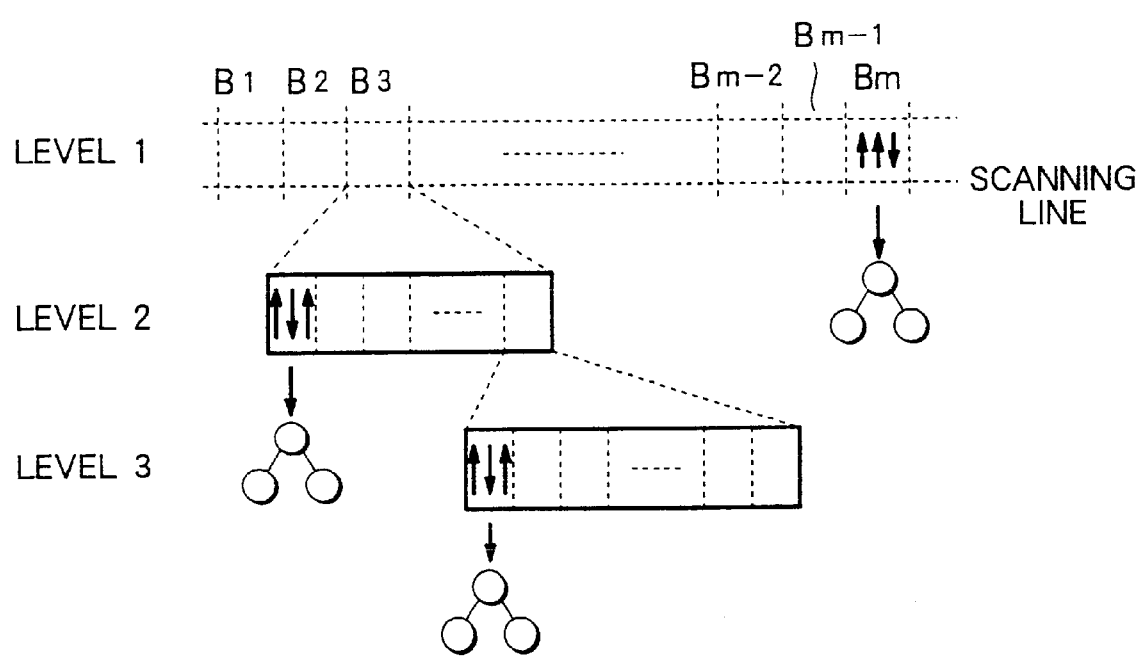
FIG. 3 is a schematic view for explaining a storing method of line segment data.

Next, a storing method of the line segment data when carrying out the above processing will be explained with reference to FIGS. 3 and 4.

Figure 4:
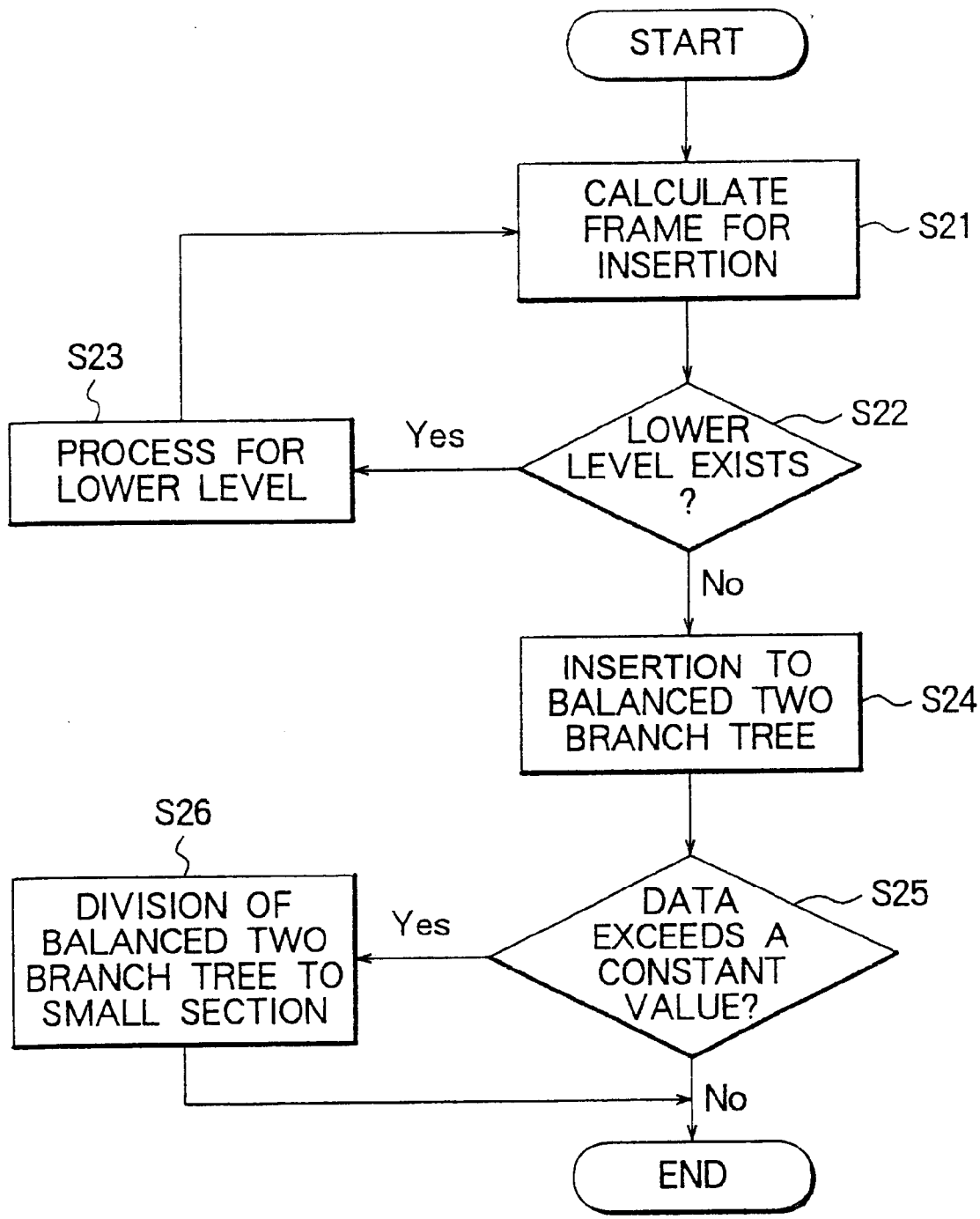
FIG. 4 is a flow chart for explaining processing when newly inserting line segment data to the storing method having a structure shown in FIG. 3.

FIG. 4 is a schematic view for explaining the method for storing line segment data.

First, as explained above, each line segment as a processing unit for the graphic signal processing divided by the scanning lines is stored as data in the tree structure of evenly divided into two for each partial region obtained by dividing the overall pattern data into a plurality of data.

This partial region is formed by the plurally dividing pattern data in a direction of the line segment removed in the processing of indicating the line segments as a vector. In the present embodiment, as shown in FIG. 3, a pattern data region is equally divided by m in a direction of the X axis to form divided regions B1 to Bm.

In a region where the line segments exist intensively, the line segments are further divided to form data in the tree structure of evenly divided into two for each divided region. That is, as a region $B_3$ in FIG. 3, the region is subdivided to configure the tree structure of evenly divided into two for every divided region of level 2. If the line segments still intensively exist in the region, the region is further subdivided to form divided regions of level 3 and configure the tree structure of evenly divided into two for every region.

The processing procedures for inserting data to the the region data to be each data in the tree structure of evenly divided into two as above will be explained with reference to the flow chart of FIG. 4.

First, when there arises a line segment to insert, the calculation of an inserting section is carried out in the uppermost layer (level 1) which is higher than the position of the line segment data (step S21). Then, it is checked if there is any divided region of lower level in (step S22). When there is, the line segment processed is moved to the lower level (step S23), and the calculation of an inserting section in the region is carried out again (step S21).

When reaching to the level configured in the tree structure of evenly divided into two by repeating the above processing, the line segment data is inserted to the tree structure of evenly divided into two of the region of the level (step S24).

When insertion of the data is completed, it is checked if a number of data stored in the tree structure of evenly divided into two exceeds a certain value (step S25). When exceeded, the tree structure of evenly divided into two in the region is divided to prepare a lower level tree structure of evenly divided into two (step S26) and a series of the processing is completed.

Note that while insertion of data was explained in FIG. 4, the deleting of data can be carried out in the same way. When deleting data, the processing in step S24 becomes deleting of data, the processing in step S25 becomes a processing for checking if the number of data stored in the tree structure of evenly divided into two is less than a certain value, and the processing in step S26 becomes the processing for unifying a plurality of tree structures of evenly divided into two to return to one tree structure of evenly divided into two.

When simply searching the data, the data may be read in the processing of step S24 and the processing corresponding to the processing of steps S25 and S26 becomes unnecessary.

In this way, in the present embodiment, when generating mask pattern data for graphics, a section including the line segment is divided into a plurality partial sections. A data storing method in the tree structure of evenly divided into two is prepared for the each partial section to store the line segment data. Accordingly, the depth of the tree structure of evenly divided into two can be reduced compared with a case of configuring the whole in one tree structure of evenly divided into two, so that the execution time for inserting, deleting and searching of the data can be short.

A region including a large amount of data for existing line segments is further divided to form the tree structure of evenly divided into two. Therefore, it is possible to keep a depth of data in one tree structure of evenly divided into two at a certain value or less, so that the execution time for inserting, deleting and searching data can be short even for uneven data.

As a result, it is possible to make the overall graphic signal processing at a high speed and the processing for generating mask pattern data for graphics can be carried out at a high speed and effectively.

Note that the present invention is not limited to the above mentioned embodiment and a variety of modification can be made.

Figure 5:
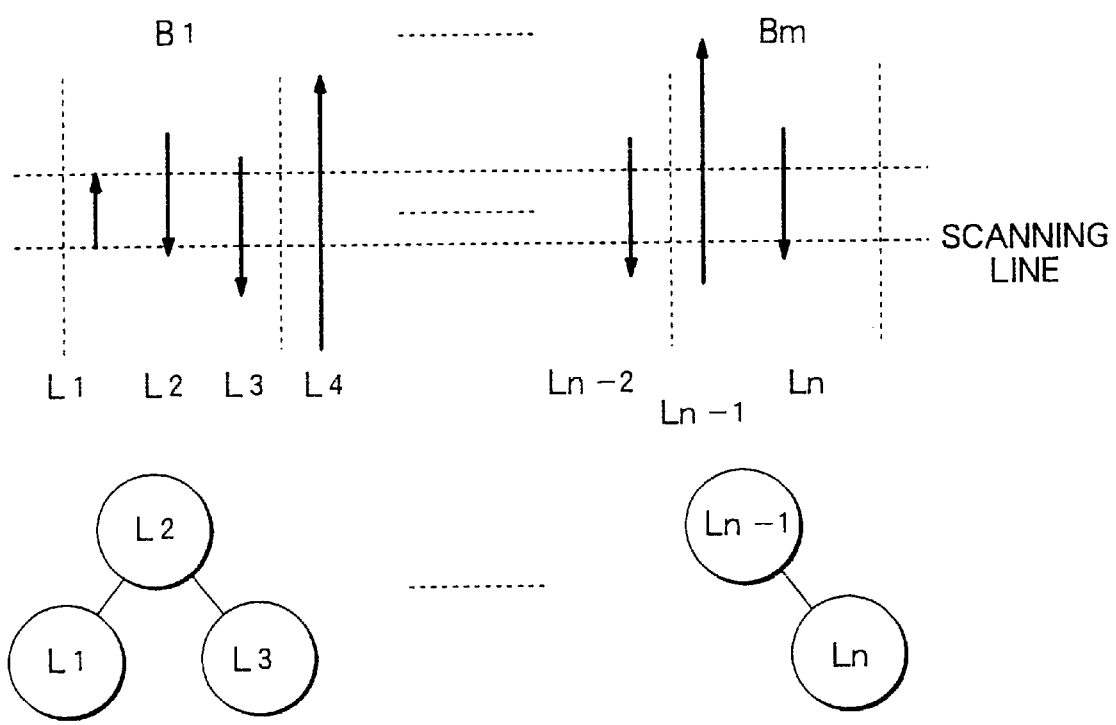
FIG. 5 is a schematic view for explaining a modified example of a storing method of line segment data.
Figure 6A:
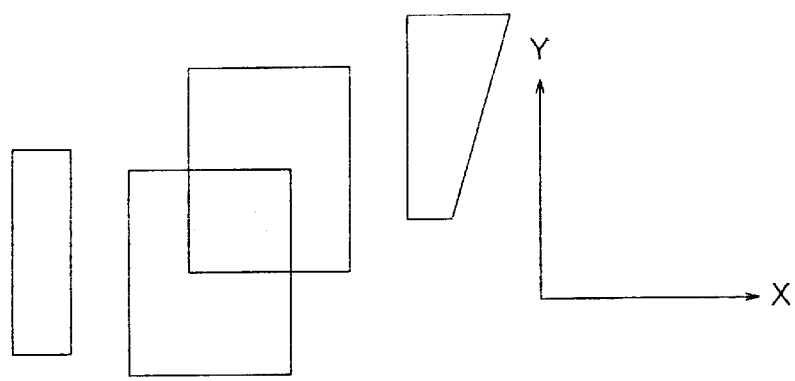
Figure 6B:
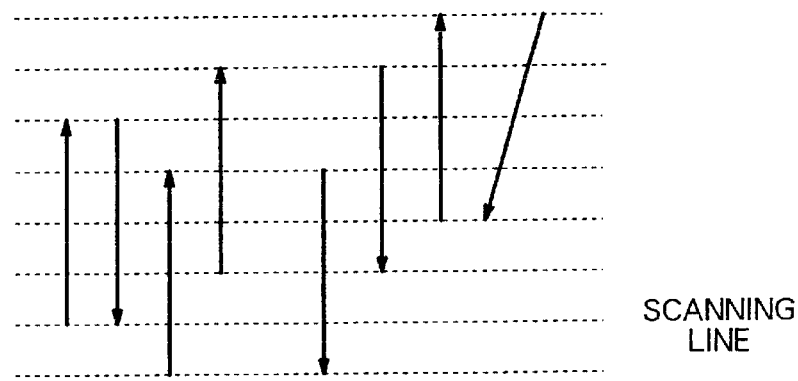
Figure 6C:
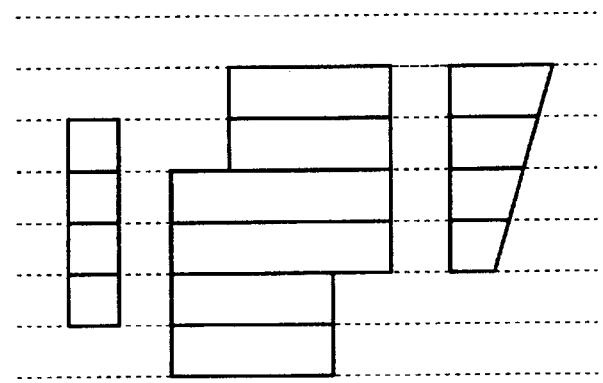
Figure 7A:
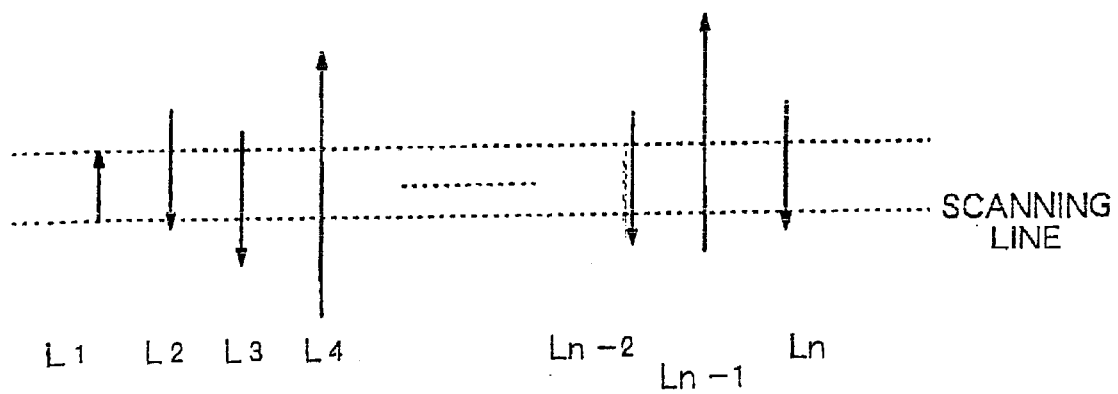
FIGS. 7A and 7B are views for explaining a storing method of a line segment data of the related art.
Figure 7B:
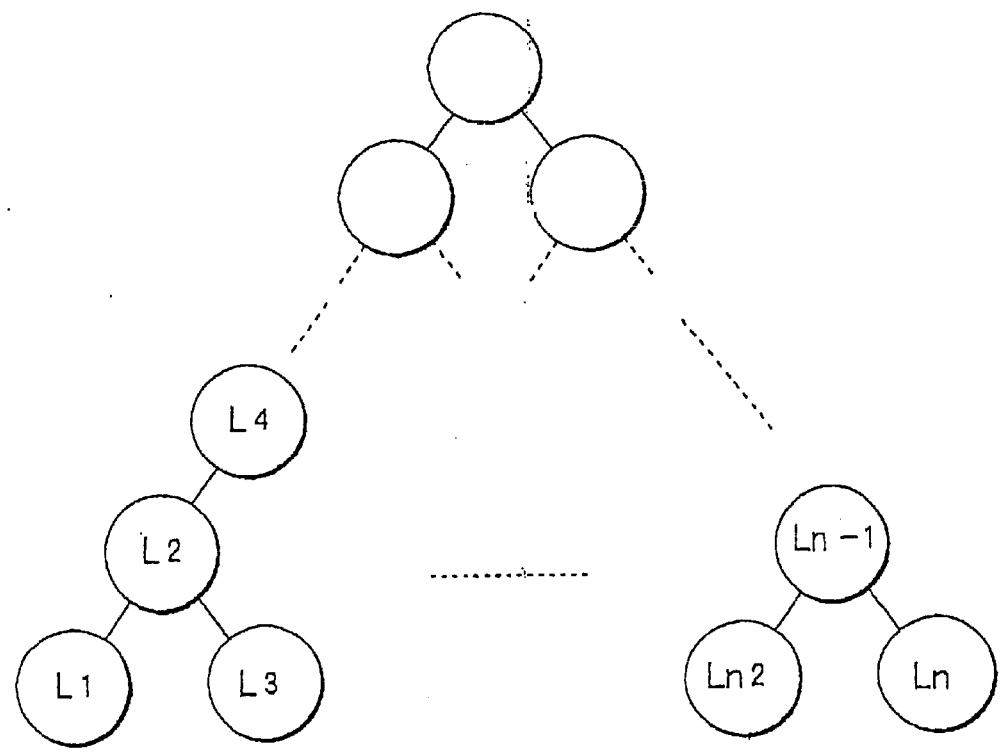

For example, in the present invention, when the line segments existed intensively, tree structures of evenly divided into two were increased by properly dividing the region and when the line segments are reduced, the tree structure of evenly divided into two were reduced. However, for simplification, a method for controlling the number of such tree structure of evenly divided into two, as shown in FIG. 5, by previously preparing one tree structure evenly divided into two for every divided region including the pattern data for accessing simply can be used. When the line segment data is arranged equally, such a basic method can be used in the present invention.

Also, in the present embodiment, the dividing of a region is constrained to dividing a region including a pattern equally into a predetermined number. However, any other dividing methods can be adopted.

For example, if the conditions of the intensity of the line segment data can be predicted to some extent, the dividing of region can be carried out based on the condition. Such a condition is preferable because, without the processing of further dividing as above, the tree structure of evenly divided into two wherein the line segment data is equally arranged can be configured with a simple processing.

Also, in executing the processing, a dividing position of the region is preferably at a position of a scanning line closest to the position of dividing equally a region including a pattern into a predetermined number.

In the present embodiment as a specific content of graphic signal processing, examples of processing to eliminate overlapping and processing of inter-layers were given. However, any processing other than that can be carried out.

Also, an apparatus for generating mask pattern data of the present invention was explained that it is configured by general-purpose arithmetic operation apparatuses, etc. However, it can be also configured by an apparatus for performing only the above processing.

As explained above, according to the present invention, an access speed to the line segment data can be made higher, so that it is possible to provide a method for generating mask pattern data capable of generating the mask pattern data for the electron beam graphic drawing at a high speed. Also, by making the accessing speed to the line segment data higher, it becomes possible to provide an apparatus for generating mask pattern data capable of generating in the mask pattern data for electron beam graphic drawing at a high speed.

While the invention has been described with reference to the specific embodiments chosen for purpose of illustration, it should be apparent that numerous modifications could be made thereto by those skilled in the art without departing from the basic concept and scope of the invention.

What is claimed is:

1. A method of generating mask pattern data for generating mask pattern for graphic processing from mask pattern data indicated by line segments including at least line segments indicating a contour of a mask pattern, said method including the steps of:

extracting the line segments except for line segments in a predetermined direction from the line segments of said mask pattern data;

dividing each of said extracted line segments by a line in parallel to said predetermined direction passing through both ends of each of said line segments;

dividing a region of said mask pattern into a plurality of divided regions in said predetermined direction;

storing each of said divided line segments existing in said divided regions in a tree structure that is evenly divided into two for each of said divided regions;

accessing each of stored line segments in the tree structure that is divided into two for each of said regions; and generating mask pattern data for the graphic processing in which a contour of the mask pattern is indicated by the line segments on the basis of the results of said graphic processing.

2. The method of generating mask pattern data as set forth in claim 1, wherein said graphic processing is further defined as a processing to eliminate overlapping portions from said mask pattern data in which overlapping is accepted.

3. The method of generating mask pattern as set forth in claim 1, wherein said graphic processing generates mask pattern data of a corresponding layer based on mask pattern data of other layers.

4. The method of generating mask pattern data as set forth in claim 1, wherein each of said divided regions is further divided to keep line segments existing in said divided regions at not more than a predetermined value when a number of said divided line segments existing in the divided regions is larger than a predetermined constant value.

5. The method of generating mask pattern as set forth in claim 1, wherein the step of generating mask pattern data based on the results of said graphic processing includes the steps of:

detecting a pair of line segments indicating contour of an identical mask pattern in each of said divided regions from the line segments obtained from the results of said graphic processing;

wherein, when both of the pair of line segments are continuous between continuous divided regions, forming a new pair of line segments unifying the continuing portions and crossing between said divided regions; and connecting corresponding ends of said line segments by a line segment in said predetermined direction to said new formed pair of line segments and said pair of line segments detected and not unified.

6. An apparatus for generating mask pattern data from mask pattern data indicated by line segments including at least line segments indicating a contour of a mask pattern, said apparatus comprising:

a line segment extracting means for extracting line segments except for line segments in a predetermined direction from the line segments of said mask pattern data;

a line segment dividing means for dividing each of said extracted line segments by a line parallel to said predetermined direction passing through both ends of each of line segments;

a region dividing means for dividing a region of said mask pattern into a plurality of divided regions in said predetermined direction;

a line segment storing means for storing each of said divided line segments existing in the divided regions in a tree structure that is evenly divided into two for each of said divided regions;

a graphic processing means for performing graphic processing for a unit of processing for each of said divided line segments by accessing each line segment stored in said tree structure evenly divided unto two for each of said divided regions, and;

a graphic data generating means for generating mask pattern data indicating contour of a mask pattern by line segments based on the results of said graphic processing.

7. The apparatus for generating mask pattern data as set forth in claim 6, wherein said graphic processing means comprises an overlapping eliminate means to eliminate overlapping portions from mask pattern data in which overlapping is accepted.

8. The apparatus for generating mask pattern data as set forth in claim 6, wherein said graphic processing means comprises in-between layers processing means for generating mask pattern data of a layer based on mask pattern data of other layers.

9. The apparatus for generating mask pattern data as set forth in claim 6, further comprising:

a region subdividing means for further dividing each of said divided regions to suppress the number of line segments existing in said divided regions to not more than a predetermined number when a number of said divided line segments existing in said divided regions are more than the predetermined number; and wherein said line segment storing means stores each of said subdivided line segments existing in the divided regions for each of said subdivided regions in a tree structure that is evenly divided into two.

10. The apparatus for generating mask pattern data as set forth in claim 6, comprising:

a corresponding line segment detecting means for detecting a pair of line segments indicating contour of identical mask pattern in each of said divided regions from the line segments obtained from the results of said graphic processing means;

a line segments unifying means for forming a new pair of line segments crossing between said divided regions by unifying continuous portions when both of the pair of line segments are continuous between said divided regions among said pair of line segments detected; and a rectangle forming means for combining corresponding ends of the line segments by a line in said predetermined direction to new formed pair of line segments and said pairs of line segments detected and not unified.

* * * * *